(12) United States Patent
Hosseini et al.

(10) Patent No.: US 8,896,128 B2
(45) Date of Patent: Nov. 25, 2014

(54) INTEGRATED CIRCUIT, A SEMICONDUCTOR DIE ARRANGEMENT AND A METHOD FOR MANUFACTURING AN INTEGRATED CIRCUIT

(71) Applicant: Infineon Technologies AG, Neubiberg (DE)

(72) Inventors: Khalil Hosseini, Weihmichl (DE); Joachim Mahler, Regensburg (DE); Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 75 days.

(21) Appl. No.: 13/678,675

(22) Filed: Nov. 16, 2012

(65) Prior Publication Data

US 2014/0138841 A1 May 22, 2014

(51) Int. Cl.
*H01L 23/48* (2006.01)
*H01L 23/52* (2006.01)
*H01L 29/40* (2006.01)
*H01L 21/56* (2006.01)

(52) U.S. Cl.
CPC .............. *H01L 23/481* (2013.01); *H01L 21/56* (2013.01)
USPC ........................................................ 257/774

(58) Field of Classification Search
USPC .................. 257/625, 676, E27.137, E27.144, 257/E27.161, E23.023, E23.077, 787–796, 257/E23.001–E23.194, E23.181, 257/E21.499–E21.519, E23.021, E23.069, 257/41, 81, 82, 91, 99, 177–182, 276, 457, 257/459, 502, 503, 573, 584, 602, 621, 257/664–677, 678–733, 734–786, 257/E23.01–E23.079, E23.141–E23.179, 257/100, 433, 434, 667, E31.117–E31.118, 257/E51.02, E23.116–E23.14, 257/E21.502–E21.504, 685, 686, 257/E25.031–E25.032, E23.042, E21.597; 438/15, 51, 55, 83, 98, 100, 101, 411, 438/412, 461, 584, 597–688, 64–67, 25–28, 438/106–127

See application file for complete search history.

(56) References Cited

U.S. PATENT DOCUMENTS

| 2009/0243074 | A1 | 10/2009 | Ramiah et al. |
| 2009/0278244 | A1* | 11/2009 | Dunne et al. ................... 257/676 |
| 2010/0252934 | A1* | 10/2010 | Law et al. ...................... 257/774 |
| 2013/0026646 | A1* | 1/2013 | Adkisson et al. ............. 257/774 |
| 2013/0087850 | A1* | 4/2013 | Alberhasky et al. .......... 257/329 |

* cited by examiner

*Primary Examiner* — Dao H Nguyen
*Assistant Examiner* — Tram H Nguyen

(57) ABSTRACT

An integrated circuit is provided, the integrated circuit including: a chip having a first chip side and a second chip side opposite to the first chip side, the chip having at least one contact area on the second chip side; encapsulation material at least partially covering the chip; and at least one contact via comprising electrical conductive material contacting the at least one contact area and extending through the encapsulation material and through the chip between the first chip side and the second chip side.

28 Claims, 8 Drawing Sheets

At least partially covering a chip with encapsulation material, the chip having a first chip side and a second chip side opposite to the first chip side, the chip including at least one contact area on the second chip side ~ 110

Forming at least one contact via extending through the encapsulation material and through the chip between the first chip side and the second chip side, the at least one contact via contacting the at least one contact area ~ 120

~ 510

~ 510

INTEGRATED CIRCUIT, A SEMICONDUCTOR DIE ARRANGEMENT AND A METHOD FOR MANUFACTURING AN INTEGRATED CIRCUIT

TECHNICAL FIELD

Various embodiments relate generally to an integrated circuit, a semiconductor die arrangement and a method for manufacturing an integrated circuit.

BACKGROUND

Power semiconductor components and electronic circuits are typically electrically contacted and/or electrically wired using technologies used for forming standard housing connections, such as wires or clips or galvanic contacts. With standard methods, several serial and complex connections processes at the housing level are necessary, for example, both front side and back sides of the power integrated circuit may have to be contacted at the housing level, e.g. through a mold compound. This may contribute to a limited integration density and considerable integration overhead of the components.

SUMMARY

Various embodiments provide an integrated circuit including: a chip having a first chip side and a second chip side opposite to the first chip side, the chip having at least one contact area on the second chip side; encapsulation material at least partially covering the chip; and at least one contact via comprising electrical conductive material contacting the at least one contact area and extending through the encapsulation material and through the chip between the first chip side and the second chip side.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a method for manufacturing an integrated circuit according to an embodiment;

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" may also be used herein to mean that the deposited material may be formed "indirectly on" the implied side or surface with one or more additional layers being arranged between the implied side or surface and the deposited material.

Various embodiments provide a method for contacting and wiring power semiconductor components based on through silicon vias (TSV).

Various embodiments provide an integrated circuit, wherein the chip contacts on a front side or a back side may be connected and wired by the generation of electrical through-contacts directly through and/or in a wafer, e.g. a silicon wafer. Furthermore, a drain region may be formed near a source region and/or gate region, by redirecting a drain contact to the same side as a gate contact and a source contact.

According to various embodiments, by means of through silicon vias in power semiconductor circuits, the contact connections, e.g. external contact connections, may be formed internally within the wafer, and may be created on one side or surface. In other words, it may no longer be required to contact front and back sides of the integrated circuit at the housing level, e.g. by having to form the contacts through typical housing materials such as mold compounds.

FIG. 1 shows method 100 for manufacturing an integrated circuit according to an embodiment. Method 100 may include:

at least partially covering a chip with encapsulation material, the chip having a first chip side and a second chip side opposite to the first chip side, the chip including at least one contact area on the second chip side (in 110); and forming at least one contact via extending through the encapsulation material and through the chip between the first chip side and the second chip side, the at least one contact via contacting the at least one contact area (in 120).

FIGS. 2A to 2L show method 200 for manufacturing an integrated circuit according to various embodiments.

Figure 2A:
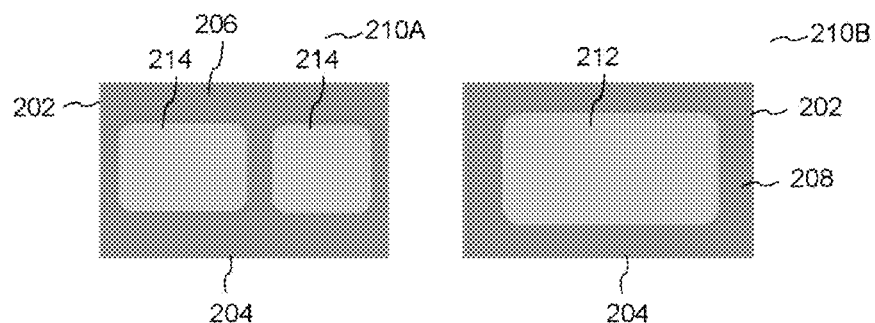
FIG. 2A shows a top view and bottom view of an integrated circuit according to an embodiment.

FIG. 2A shows top view 210A and bottom view 210B of an illustration of part of an integrated circuit 202 according to an embodiment. Integrated circuit 202 may include chip 204. Chip 204 may be a semiconductor chip 204 and may include, or may be referred to as a semiconductor die. Top view 210A shows an illustration of first chip side 206, i.e. referred to as top side or front side, of chip 204. Bottom view 210B shows an illustration of second chip side 208, i.e. referred to as bottom side or back side, of chip 204. Second chip side 208 may be opposite to first chip side 206, in other words second chip side 208 may face a direction substantially opposite to a direction which first chip side 206 faces. Chip 204 may include at least one contact area 212 which may be formed over or on second chip side 208 during a stage of processing according to method 200. At least one contact area 212 may be referred to as a back side electrode(s) or a back side metallization and may be formed over second chip side 208 at this stage or at later stages of the process. Chip 204 may include or be a power semiconductor chip, wherein current, i.e. electrons, may flow in a vertical direction between first chip side 206 and second chip side 208. Chip 204 may include a power semiconductor chip, wherein the power semiconductor chip may include at least one power semiconductor device from the group of power semiconductor devices, the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

Power semiconductor chips may generally support a vertical current flow between contact area 212 and further contact area 214. Chip 204 may include or be formed from a semiconductor wafer substrate which may include various materials, such as silicon, e.g. doped or undoped silicon, germanium, Group III to V materials, polymers, semiconductor compound materials, e.g. gallium arsenide (GaAs), indium phosphide (InP), gallium nitride (GaN), silicon carbide (SiC), semiconductor compound materials, e.g. indium gallium arsenide (InGaAs), or silicon on insulator (SOI) wafers.

As shown in view 210A, chip 204 may include at least one further contact area 214 formed over or directly on first chip side 206. At least one further contact area 214 may include or refer to one or more further contact areas 214. At least one further contact area 214 may be referred to as a front side electrode(s). Typically a chip comprising a power transistor may include front side electrodes, for example, a source electrode and a gate electrode. Contact area 212 may be back metallization and may be a drain electrode. The vertical current flow in power transistors may take place between the source electrode and the drain electrode through a depletion layer.

Figure 2B:
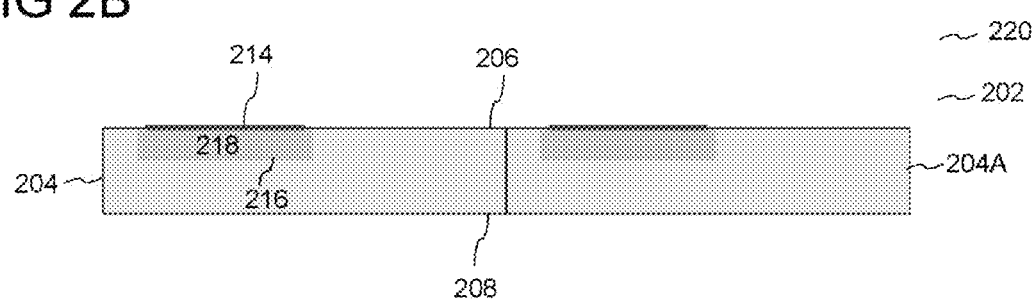
FIGS. 2B to 2L show cross-sectional views of an integrated circuit according to various embodiments.

FIG. 2B shows cross-sectional view 220 of an illustration of part of integrated circuit 202 according to an embodiment. As shown, chip 204 may be a part of a wafer substrate which may include one or more chips analogous or different to chip 204. Particularly to FIG. 2B, chip 204 is shown to have at least one neighboring chip 204A. According to some embodiments, chip 204 and chip 204A may form a half-bridge integrated circuit arrangement 202. According to other embodiments, chip 204A and chip may be separately functioning chips which may be eventually individualized from each other. It may be understood that a wafer substrate of which chip 204 may be a part, may include a plurality of chips which may be analogous or different to chip 204. The wafer substrate may carry or include one, two, three or more chips, or up to tens, hundreds or over thousands of chips.

It may further be understood that methods 100 and 200 may apply to the manufacturing of an integrated circuit, such as a chip package, including an individual chip 204 or to the batch-manufacturing of an integrated circuit, such as a chip package, including a wafer substrate with a plurality of chips, e.g. 204, 204A, and so forth.

Chip 204 may have an implanted and active area 216 (depletion layer or depletion zone) under the front side metallization, i.e. under at least one further contact area 214. Chip 204 may include one or more electronic circuits 218 formed in chip 204, e.g. in active area 216. Electronic circuits 218 may be electrical coupled, e.g. electrically connected to at least one further contact areas 214, e.g. source and/or gate regions, formed on first chip side 206. Electronic circuits 218 may be formed, e.g. previously, during front end of line (FEOL) process fabrication. Electronic circuits 218 may be electrical connected to at least one further contact area 214 by means of electrically conductive interconnect vias and/or plugs formed over active area 216, e.g. during back end of line (BEOL) process fabrication.

Figure 2C:
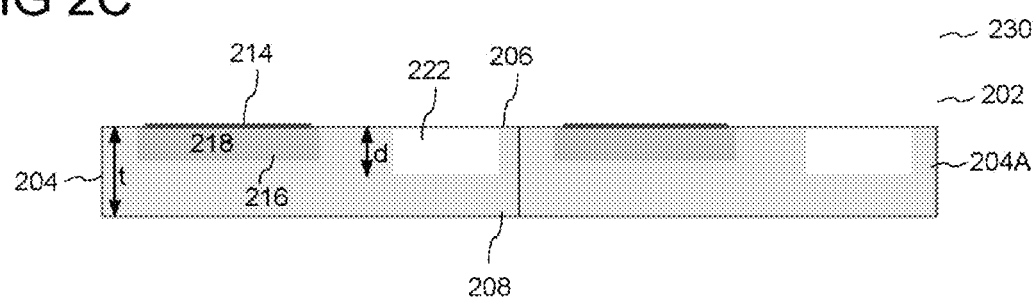

FIG. 2C shows cross-sectional view 230 of an illustration of part of integrated circuit 202 according to an embodiment. As shown in view 230, hole or cavity 222 may be formed in chip 204 near active area 216. Hole or cavity 222 may be formed in the wafer substrate of chip 204. Hole or cavity 222 may be formed at first chip side 206, and hole or cavity 222 may reach a substantially vertical depth deeper than a vertical depth of active area 216 from first chip side 206. Hole or cavity 222 may be formed by an etching process which may remove material from the wafer substrate of chip 204. Such an etching process may include a Bosch process, for example, if the wafer substrate of chip 204 includes silicon. Chip 204 may have an original thickness, t, ranging from about 300 µm to about 1 mm. Hole or cavity 222 may have a depth, d, ranging from about 20 µm to about 400 µm, e.g. from about 50 µm to about 350 µm, e.g. about 80 µm to about 250 µm. However, it may be understood that depth d may not be limited to these values and may include other values as well according to other embodiments. It may be understood that according to some embodiments, hole or cavity 222 may not fully penetrate chip 204, e.g. from first chip side 206 to second chip side 208, and neighboring chips, e.g. 204, 204A, may be commonly held by remaining wafer substrate material.

Figure 2D:
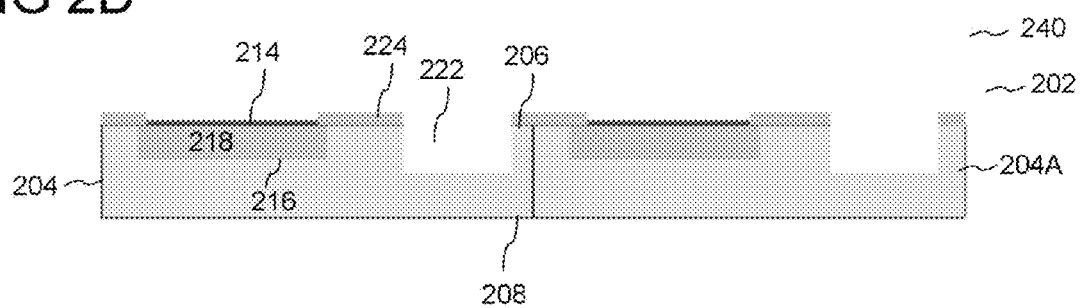
Figure 2E:
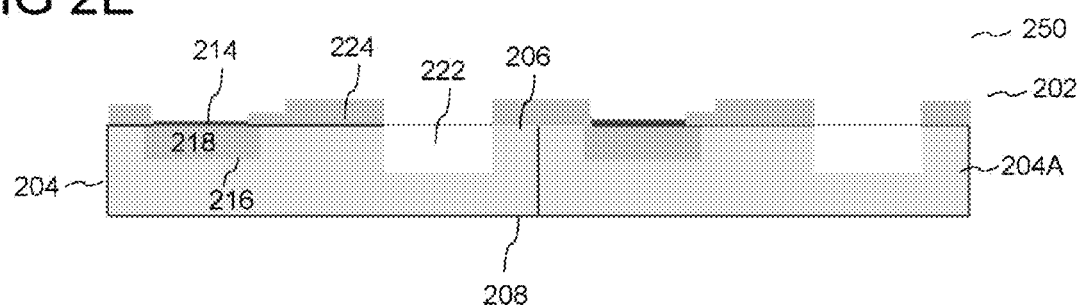

FIG. 2D shows cross-sectional view 240 of an illustration of part of integrated circuit 202 according to an embodiment. In view 240, chip 204 may be at least partially covered with encapsulation material 224. Encapsulation material 224, e.g. a passivation material may be deposited over chip 204. Encapsulation material 224 may be electrically insulating. Encapsulation material 224 may be deposited over chip first side 206, for example, next to the front side metallization contact areas, e.g. adjacent to further contact area(s) 214, and to the etched structure, i.e. hole or cavity 222 in chip 204. According to some embodiments, encapsulation material 224 may be deposited substantially entirely over chip first side 206, except for over further contact area(s) 214 and cavity 222. In other words, further contact area(s) 214 and cavity 222 may be free of encapsulation material 224.

Another option may be to spin coat encapsulation material (e.g. PI), if desired in multiple layers, to let the encapsulation material (e.g. PI) spread over the wafer. The encapsulation material (e.g. PI) will then also cover the side walls of the IC if they are pre diced; further it will creep in the TSV holes. Alternatively and for large panels, the encapsulation material (e.g. PI) could be applied by a spray coating process. After applying, usually imaging, develop and stripping follows (photo structuring), then curing. Finally the IC side walls are covered with PI such as the walls of the vias.

If it is desired to work with a non photosensitive material (e.g. on low structuring requirements), after curing a post structuring is applied by lasering (PI may be burnt away where not required). Encapsulation material 224 may include at least one of silicon dioxide and silicon nitride and may be deposited and/or formed by means of a deposition process, e.g. chemical vapor deposition (CVD) process. According to some embodiments, encapsulation material 224 may include a laminate or molding material, e.g. a polymer, epoxy, acrylate, high temperature thermoplastic or silicone, which may be deposited by lamination.

According to other embodiments, formation of encapsulation material 224 on chip first side 206 may include a threedimensional structuring process. As shown in cross sectional view 250 of an integrated circuit of FIG. 2E, encapsulation material 224 may be optionally further formed and/or structured by a combination of CVD processes and masking and/or selective removal. Therefore, various geometries of encapsulation material 224 may be formed depending on the requirements and/or design of the integrated circuit.

It may be understood that according to various embodiments, chip 204A and chip 204 may be formed in a continuous wafer substrate, and may therefore be arranged as a further half-bridge circuit with at least two semiconductor circuit elements (e.g. in chip 204A and chip 204.)

Figure 2F:
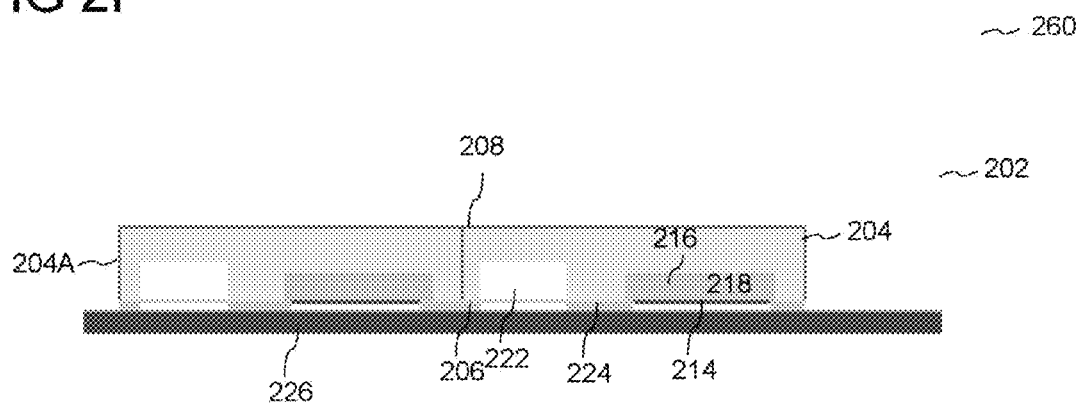
Figure 2G:
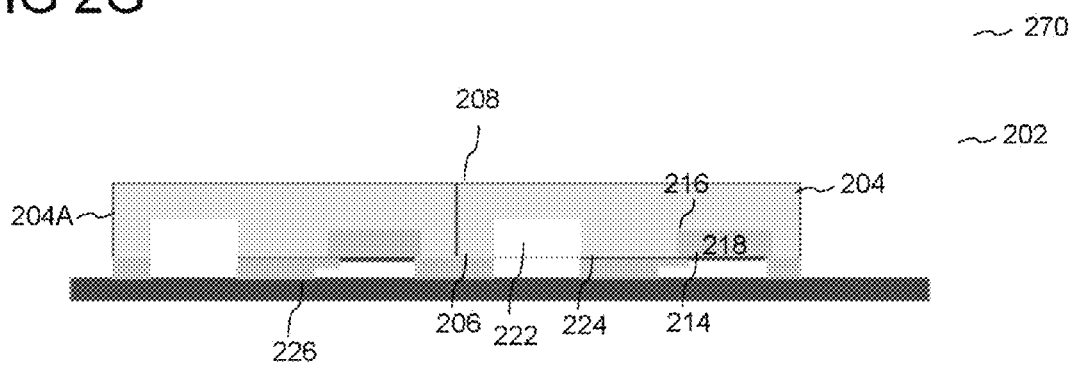

As shown in FIGS. 2F and 2G, chip 204 which may have be etched, metalized and passivated, may be disposed over and/or mounted over or directly on temporary carrier 226. As shown in cross-sectional views 260 and 270, first chip side 206 may be temporarily adhered to temporary carrier 226, e.g. by means of a thermal release glue and/or adhesive. Chip 204 may be mounted over or directly on temporary carrier 226 in preparation for thinning of chip 204, e.g. from second chip side 208.

Figure 2H:
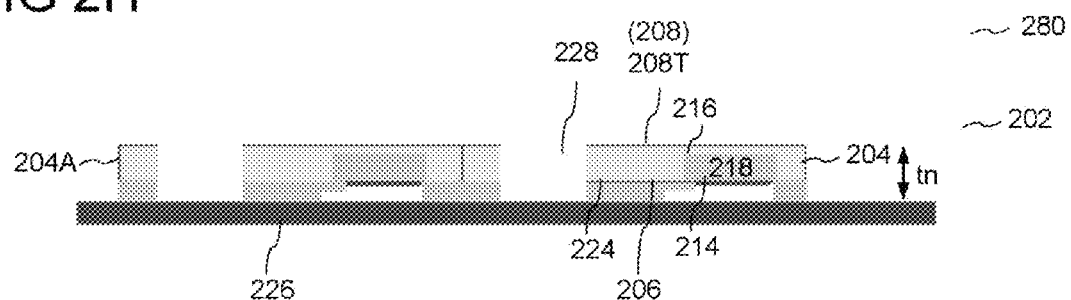

FIG. 2H shows cross-sectional view 280 of an illustration of part of integrated circuit 202 according to an embodiment. A thinning process may be carried out, wherein chip 204 may be thinned from second chip side 208, e.g. from the chip back side, to achieve the required thickness of chip 204. The thinning process may be carried out mechanically, e.g. through mechanically grinding, or chemically, e.g. thorough etching, or by a mixture of the chemical and mechanical processes. Removal of material from second chip side 208, i.e. thinning, may be carried out until hole or cavity 222 forms channel 228 through chip 204, wherein channel 228 may extend between first chip side 206 and second chip side 208T. It may be understood that channel 228 may penetrate fully through a surface of chip 204 at first chip side 206, e.g. a top surface of chip 204, to a surface of chip 204 at second chip side 208, e.g. a bottom surface of chip 204. Second chip side 208T may be analogous to second chip side 208 already mentioned, except that second chip side 208T may be second chip side 208 after thinning. No wafer substrate material, e.g. silicon, may be found over and/or under the etch structure hole or cavity 222. The thickness of chip 204 after thinning, tn, may range from about 20 µm to about 400 µm, e.g. from about 50 µm to about 350 µm, e.g. about 80 µm to about 250 µm.

Figure 2I:
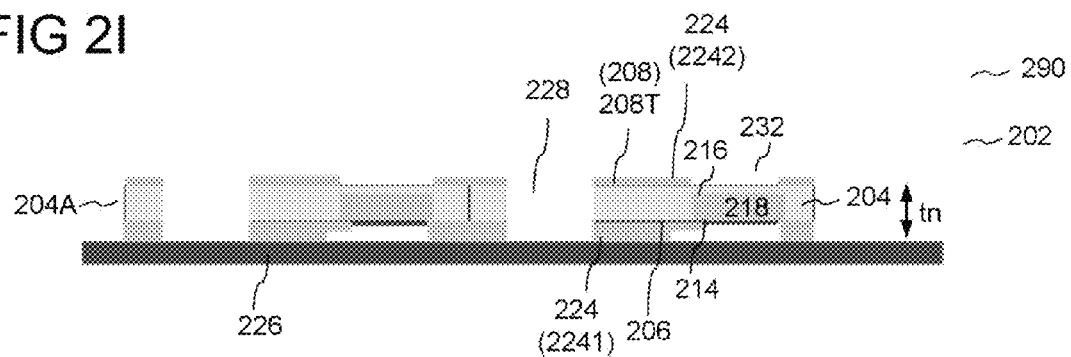

FIG. 2I shows cross-sectional view 290 of an illustration of part of integrated circuit 202 according to an embodiment.

Encapsulation material 224 may be formed over second chip side 208 of chip 204 in a process analogous to the formation of encapsulation material 224 over first chip side 206 as described according to FIGS. 2D and/or 2E. Encapsulation material 224 may be structured and disposed over second chip side 208 to passivate second chip side 208 as described according to FIGS. 2D and/or 2E. As a result, chip 204 may be at least partially covered with encapsulation material 224 deposited over first chip side 206 and second chip side 208. Encapsulation material 224 may include first encapsulation portion 2241 disposed over first chip side 206 and second encapsulation portion 2242 disposed over second chip side 208. Second encapsulation portion 2242 may be disposed substantially entirely over second chip side 208, except in area 232, which may be where at least one contact area 212 may be subsequently formed (not yet shown) and over channel 228. Both sides of chip 204 may be passivated, while chip 204 remains on temporary carrier 226. The via 236 may be isolated by side wall passivation.

Figure 2J:
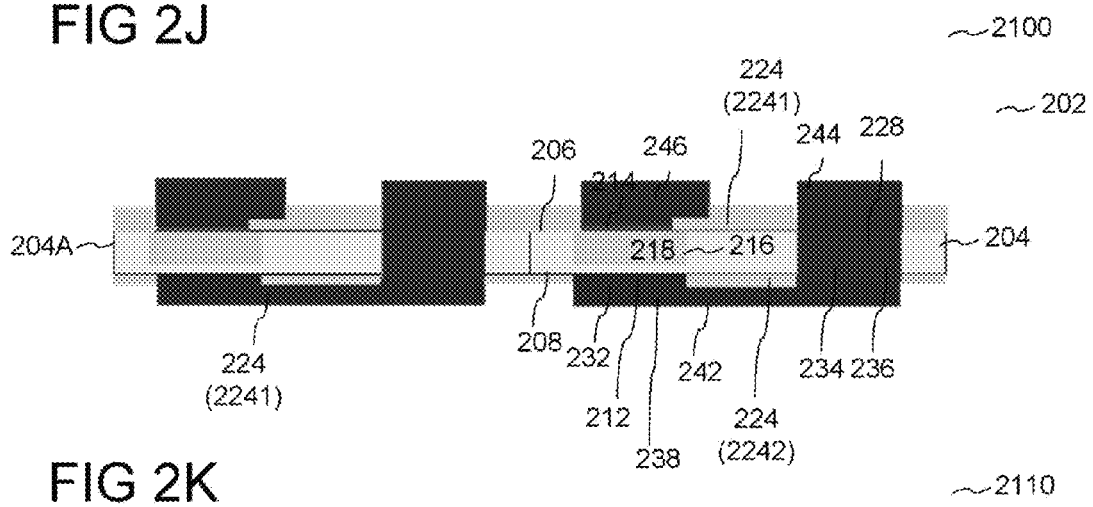

FIG. 2J shows cross-sectional view 2100 of an illustration of part of integrated circuit 202 according to an embodiment.

Electrical contacting and wiring may be carried out to provide external electrical interconnects contacting chip contact pads such as contact area(s) 212 and further contact area(s) 214.

According to some embodiments, a deposition process may optionally be carried out to form a back side metallization over area 232 in order to form a back side electrode, e.g. a drain electrode. This back side electrode may include or be contact area 212 and may also be in electrical connection with electronic circuits 218.

According to other embodiments, contacts, vias and wiring, including the formation of contact area 212 may be formed by a galvanic process and even in a single process. A masking process, e.g. photolithography, may be carried out to expose areas which are to be electrically wired, e.g. plated. Areas where metallization may not be required may be covered using a mask, e.g. a photomask.

A metallic seed layer may be deposited over, e.g. directly on, contact area(s) 214 and/or area 232 and/or in channel 228. Particularly, the metallic seed layer may be deposited in areas which were not covered by encapsulation material 228. In other words, the metallic seed layer may be deposited in the areas, e.g. contact area 212 and at least part of channel 228, which were selectively left exposed, i.e. uncovered, by the deposition of encapsulation material 228, as described according to FIGS. 2D and 2I. Subsequently, electroplating may be carried out, and areas over which the metallic seed layer was deposited may be plated and/or covered with electrically conductive material 234 and/or metal. A typical metallic seed layer and/or electroplated material may include metals, e.g. copper. However, various embodiments are not restricted to including only copper.

By plating, electrically conductive material 234 may be deposited over chip 204. Electrically conductive material 234 may be formed in and/or over area 232 and may also form a contact area 212, i.e. a back side metallization layer which may be in electrical connection with one or more electronic circuits 218. Electrically conductive material 234 may be formed on and/or include contact area 212. Electrically conductive material 234 may be formed over at least part of encapsulation material 224 disposed over second chip side 208, e.g. second encapsulation portion 2242.

Due to the selective placement of encapsulation material 224 over first chip side 206 and second chip side 208, electrically conductive material 234 may be plated and may form at least one contact via 236. Electrically conductive material 234 may be plated to form a continuous structure which may extend between first chip side 206 and second chip side 208. For example, contact via 236 may extend through encapsulation material 224 and through chip 204 between first chip side 206 and second chip side 208. Contact via 236 may contact or form at least part of at least one contact area 212, i.e. a back side metallization area.

Contact via 236 may be formed by depositing electrically conductive material 234 in channel 228 wherein electrically conductive material 234 may be at least partially surrounded by encapsulation material 224. Furthermore, electrically conductive material 234 may fill channel 228.

It may be understood that channel 228 may be at least partially filled with a single continuous electrically conductive structure i.e. electrically conductive material 234, to form contact via 236, wherein the single continuous electrically conductive structure may contact at least one contact area 212 and may extend between first chip side 206 and second chip side 208. Contact via 236 as a single continuous electrically conductive structure may extend through chip 204, as well as first encapsulation portion 2241 and second encapsulation portion 2242.

Contact via 236 may extend through encapsulation material 224 and through chip 204 between first chip side 206 and second chip side 208, wherein contact via 236 may be connected to contact area 212.

Contact via 236 may include a first electrically conductive portion 238 disposed over contact area 212 and second electrically conductive portion 242 disposed over encapsulation material 224, e.g. over second encapsulation portion 2242. Contact via 236 may be in direct physical and electrical connection with contact area 212.

Contact via 236 and for example electrically conductive material 234 may include at least one material, element or alloy from the following group of materials, the group of materials consisting of: copper, aluminum, silver, tin, gold, palladium, zinc, nickel, iron.

Contact via 236 may include electrically conductive contact portion 244 extending through first encapsulation portion 2241. Electrically conductive contact portion 244 may be at least partially surrounded by first encapsulation portion 2241, e.g. on the lateral sides of electrically conductive portion 244. Furthermore, electrically conductive portion 244 may protrude from encapsulation material 224, e.g. from first encapsulation portion 2241.

Contact via 236 may be at least partially surrounded by first encapsulation portion 2241 and second encapsulation portion 2242, for example, at chip first side 206 and second chip side 208 respectively.

Contact structure 246 may also be formed by electroplating. Contact structure 246 may contact, e.g. directly and/or physically, further contact area 214, e.g. contact structure 246 may be formed over further contact area 214 and may extend through encapsulation material 224, e.g. first encapsulation portion 2241.

Figure 2K:
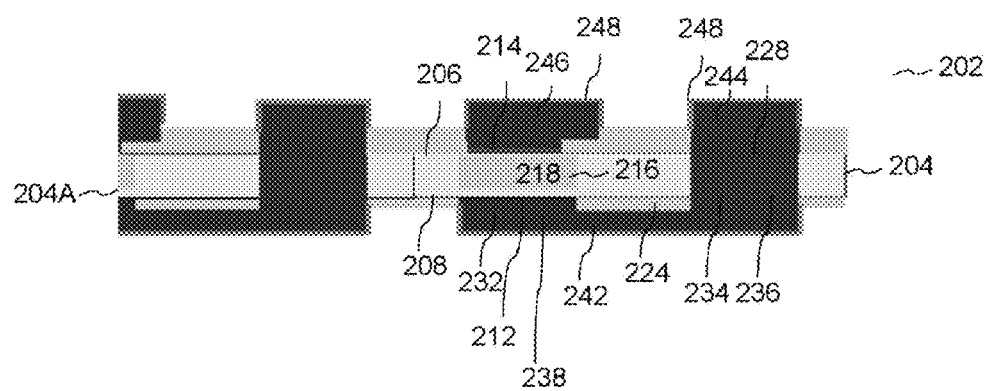

FIG. 2K shows cross-sectional view 2110 of an illustration of part of integrated circuit 202 according to an embodiment.

Solder material 248 may be deposited over first chip side 206 and/or second chip side 208. Solder material 248 may be plated on the back side, e.g. 208 and front side 206 of the wafer. For example, solder material 248 may be formed over or directly on surface regions of electrically conductive material 234. Solder material 248 may be formed over or directly on contact via 236. For example, solder material 248 may be formed directly on a surface of contact structure 246, and/or a surface of first electrically conductive portion 238, and/or a surface of second electrically conductive portion 242, and/or a surface of electrically conductive contact portion 244. The surfaces on which solder material 248 may be formed may be surfaces which may not be covered by encapsulation material 224. Furthermore, solder material 248 may be deposited directly onto these surfaces.

Solder material 248, e.g. may be a solder layer, which may be deposited by plating, e.g. electroplating, and may include at least one of NiPd, NiPdAu, PdAu, Sn, AuSn; and SnAg.

Figure 2L:
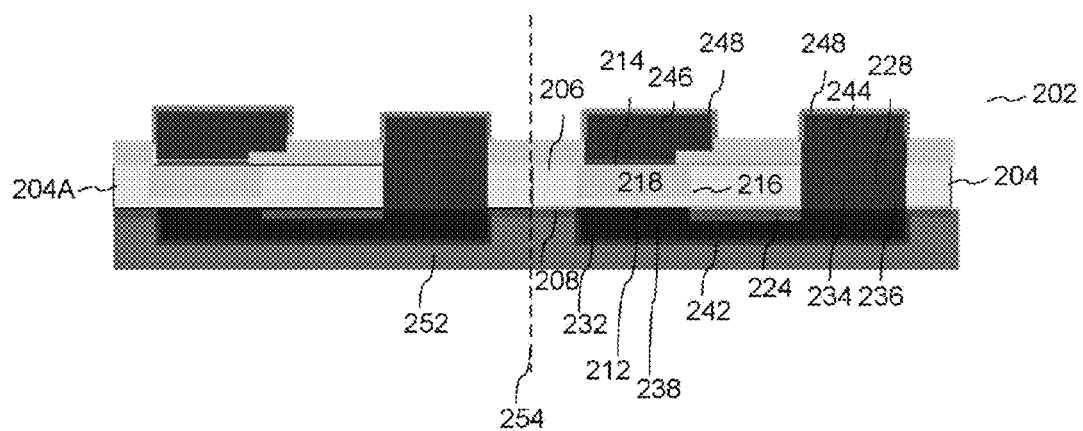

FIG. 2L shows cross-sectional view 2120 of an illustration of part of integrated circuit 202 according to an embodiment.

Further encapsulation material 252 may optionally be formed over second chip side 208, e.g. over chip back side, such that the back side of the integrated circuit device may be molded. Further encapsulation material 252 may at least partially or substantially surround first electrically conductive portion 238, second electrically conductive portion 242 and at least part of contact via 236. Further encapsulation material 252 may include a typical mold compound, for example filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

Subsequently, individualizing of chips, e.g. dicing, may be carried out to separate the individual chip components from each other. If required, chip 204 may be separated from a neighboring chip, e.g. chip 204A by separating through dicing line 254. If, as according to embodiments described above, chip 204 and chip 204A may form a single integrated circuit, e.g. a half-bridge arrangement, they may be separated from other chips using other dicing lines.

No other additional interconnects may be formed between solder material 248 and contact via 236, including electrically conductive contact portion 244. No other additional interconnects may be formed between solder material 248 and contact structure 246. Furthermore, solder material 248 may be coupled directly, e.g. directly electrically and/or directly physically connected to external circuitry, e.g. an external circuit board (not shown), e.g. a PCB via solder material 248. The coupling may be carried out using a soldering process.

According to various embodiments, fewer or no typical housing processes involving mold compounds may be required. Many serial process on the housing level which may be used during conventional processes may be replaced through fewer parallel processes at wafer level. Mold compounds, and/or forming interconnects through typical mold compounds and associated complexities may be avoided. Higher integrations densities may be achieved with good efficient cooling and high component reliability.

FIG. 2J to 2L show integrated circuit 202 according to various embodiments. Integrated circuit 202 may include: chip 204 having first chip side 206 and second chip side 208 opposite to first chip side 206. Chip 204 may at least one contact area 212 on second chip side 208. Encapsulation material 224 may at least partially cover chip 204. At least one contact via 236 may contact at least one contact area 212 and extend through encapsulation material 224 and through chip 204 between first chip side 206 and second chip side 208.

Figure 3A:
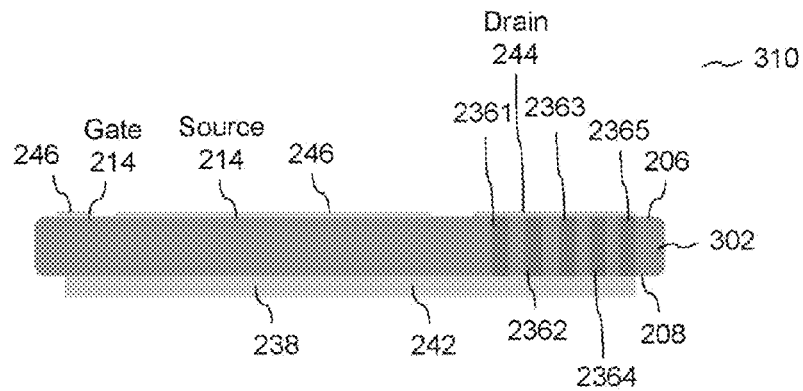
FIG. 3A shows a cross-sectional view of an integrated circuit according to an embodiment.
Figure 3B:
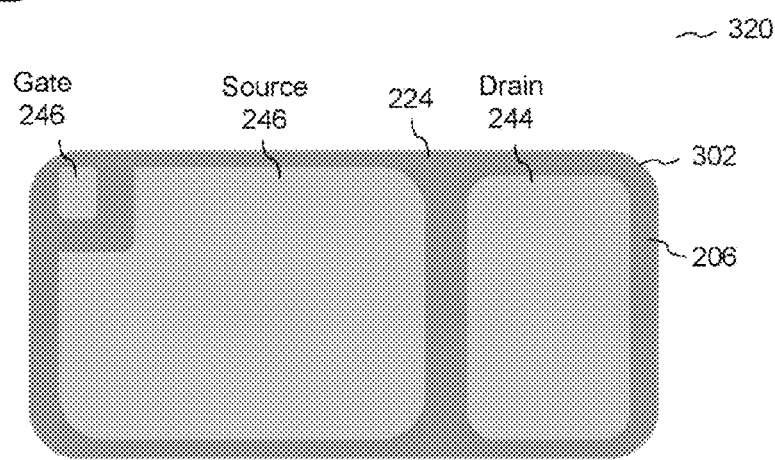
FIG. 3B shows a top view of an integrated circuit according to an embodiment.
Figure 3C:
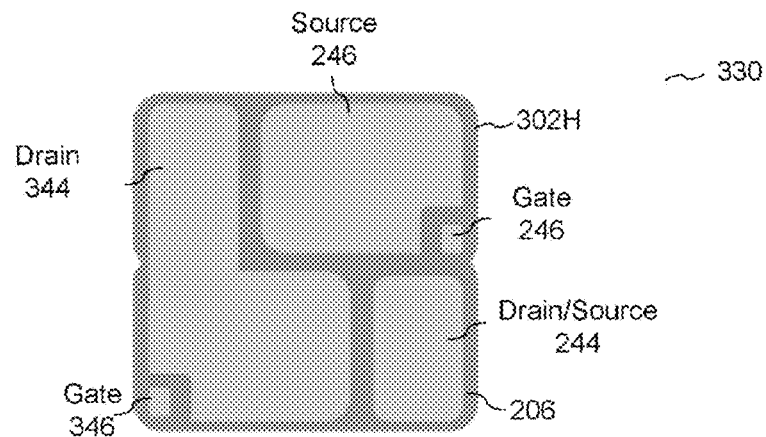
FIG. 3C shows a top view of a half-bridge integrated circuit according to an embodiment.

FIGS. 3A to 3C show views of an illustration of integrated circuits according to various embodiments.

FIG. 3A shows cross-sectional view 310 of an illustration of integrated circuit 302 according to an embodiment. According to various embodiments, integrated circuit 302 may be analogous to integrated circuit 202 and may include one or more or all of the features of already described with respect to integrated circuit 202 above. As shown according to an embodiment, integrated circuit 302 may include contact via 236 which may include a plurality of contact vias, for example contact vias 2361, 2362, 2363, 2364, 2365. According to various embodiments, integrated circuit 302 may be manufactured by forming contact via 236 or vias using a via first approach, which may connect a drain area, e.g. a backside metallization area to a wafer front side, i.e. first chip side 206. In other words, at least one contact via 236 or vias 2361, 2362, 2363, 2364, 2365, may be formed even before formation of hole or cavity 222 or channel 228.

Contact via 236 may include first electrically conductive portion 238 and second electrically conductive portion 242 formed over second chip side 208 and electrically conductive contact portion 244 formed over first chip side 206. Contact structures 246 may be formed over further contact areas 214, e.g. source and drain regions, on first chip side 206. For example, at least one contact structure 246 may be formed over each further contact area 214, e.g. over each source or gate area.

FIG. 3B shows top view 320 of an illustration of integrated circuit 302 according to an embodiment. Contact structures 246, which may be source and gate external contacts, and electrically conductive contact portion 244, which may be a drain external contact, may both be formed over first chip side 206.

FIG. 3C shows top view 330 of an illustration of integrated circuit 302H according to an embodiment. Integrated circuit 302H may included one or more or all of the features of integrated circuits 202 and 302 already described. In addition, integrated circuit 302H shows the possibility of a half-bridge circuit arrangement in a single integrated circuit. Contact structures 246, which may be source and gate external contacts of a first transistor and electrically conductive contact portion 244, which may be a drain external contact of the first transistor may be formed over first chip side 206. Furthermore, contact structure 346, which may be a gate external contact of a second transistor, and electrically conductive contact portion 344, which may be a drain external contact of the second transistor, may also be formed over first chip side 206.

The control electronics may be integrated additionally as separate integrated circuits.

Figure 4A:
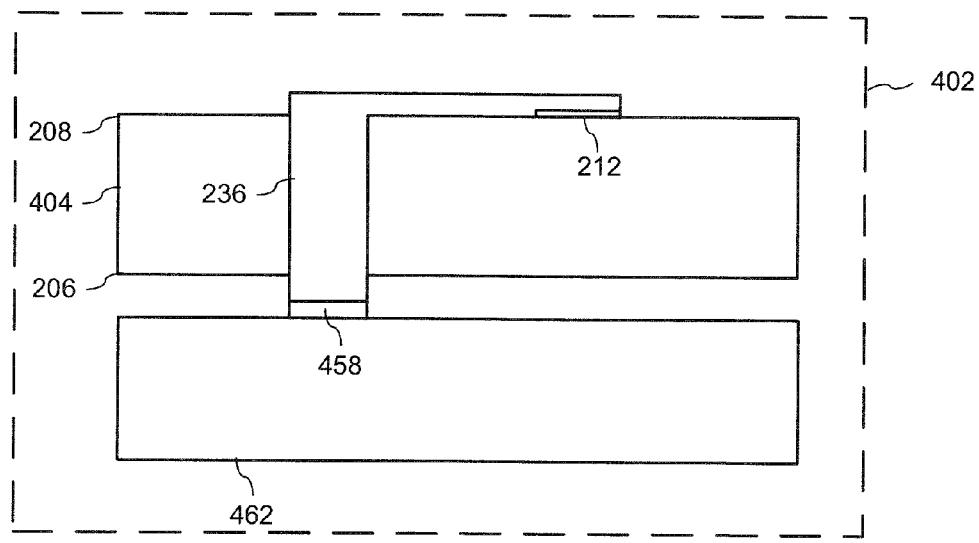
FIG. 4A shows a cross-sectional view of an illustration of a semiconductor die arrangement according to an embodiment.

FIG. 4A shows cross-sectional view 410 of an illustration of semiconductor die arrangement 402 according to an embodiment. Semiconductor die arrangement 402 may include:

semiconductor die 404;

at least one contact via 236 extending through semiconductor die 404 between first side of die 206 and second side of die 208;

wherein at least one contact via 236 may electrically connect contact area 212 on second side of die 208; and wherein at least one contact via 236 may be coupled to contacting pad 458 of external circuit board 462.

Figure 4B:
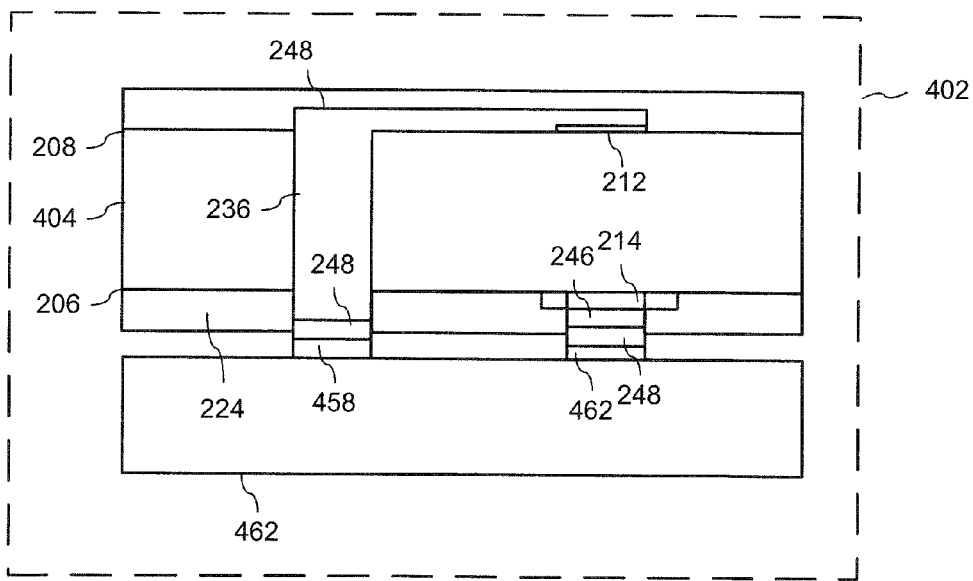
FIG. 4B shows a cross-sectional view of an illustration of a semiconductor die arrangement according to various embodiments.

FIG. 4B shows cross-sectional view 420 of an illustration of semiconductor die arrangement 402 according to various embodiments.

Semiconductor die arrangement 402 may be analogous to integrated circuit 202 and may include one or more or all of the features of already described with respect to integrated circuits 202 and 302 above.

Semiconductor die 404 may be analogous to chip 204.

Semiconductor die arrangement 402 may further include encapsulation material 224 formed over first side of die 206 and second side of die 208, and contact via 236 may extend through semiconductor die 404 and encapsulation material 224.

Solder layer 248, analogous to solder material 248, may be disposed on contact via 236. Contact via 236 may be coupled to contacting pad 458 of external circuit board 462 via solder layer 248. Contact via 236 is directly coupled to contacting pad 458 of external circuit board 462 via solder layer 248.

Semiconductor die arrangement 402 may further include at least one further contact area 214 formed on first side of die 206, and at least one contact structure 246 contacting at least one further contact area 214, wherein at least one contact structure 246 may be coupled to further contacting pad 464 of external circuit board 462. For example, contact structure 246 may be directly coupled to further contacting pad 464 of external circuit board 462 by solder layer 248 disposed over contact structure 246.

Figure 5:
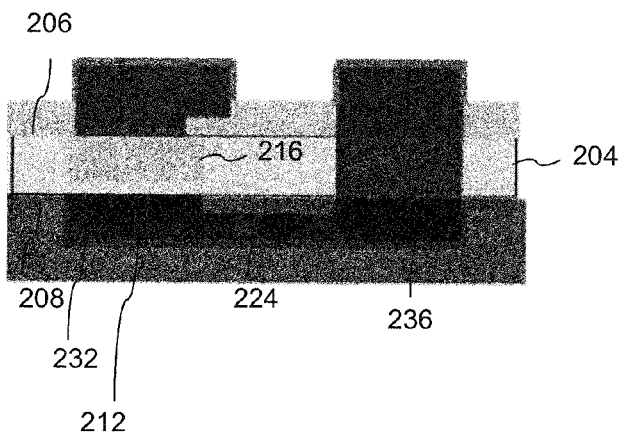
FIG. 5 shows a cross-sectional view of an illustration of an integrated circuit according to an embodiment.

FIG. 5 shows a cross-sectional view 510 of an illustration of integrated circuit 502 according to various embodiments.

Integrated circuit 502 may be analogous to integrated circuit 202 and semiconductor die arrangement 402 and may include one or more or all of the features of already described with respect to integrated circuits 202, 302 and 402 above.

Integrated circuit 502 may include chip 204 having first chip side 206 and second chip side 208 opposite to first chip side 206. Chip 204 may include a depletion zone 216 between first chip side 206 and second chip side 208, and at least one contact area 212 formed on second chip side 208. Encapsulation material 224 may at least partially cover chip 204; and at least one contact via 236 including electrical conductive material may be connected to contact area 212 and extend through depletion zone 216.

Contact via 236 may extend through encapsulation material 224 and through chip 204 between first chip side 206 and second chip side 208.

Contact via 236 may include at least one electrically conductive portion 232 formed over encapsulation material 224. Contact via 236 may include at least one of an extended pad and a mushroom pad. A mushroom pad may be created by (over-)plating. First the metal may grow in the via; at the via top it may grow laterally and vertically to form a mushroom shape. An extended pad may be bigger than the initial IC metallization or the via diameter.

Various embodiments may allow for manufacturing integrated circuits at wafer level at a cost of approximately less than 100€ per 200 mm wafer. Area overheads may make up a fraction of the die, e.g. about ¼ of the die and may cost less than 1 c€. Furthermore, parts may be used directly as bare die components Various embodiments provide an integrated circuit including: a chip having a first chip side and a second chip side opposite to the first chip side, the chip including at least one contact area on the second chip side; encapsulation material at least partially covering the chip; and at least one contact via contacting the at least one contact area and extending through the encapsulation material and through the chip between the first chip side and the second chip side.

According to an embodiment, the chip includes a semiconductor die.

According to an embodiment, the chip includes one or more electronic circuits formed in the chip, the one or more electronic circuits electrical coupled to at least one further contact area formed on first chip side.

According to an embodiment, the chip includes a power semiconductor chip, wherein the power semiconductor chip includes at least one power semiconductor device from the group of power semiconductor devices, the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

According to an embodiment, the encapsulation material includes at least one of silicon dioxide and silicon nitride.

According to an embodiment, the encapsulation material includes a first encapsulation portion disposed over the first chip side and a second encapsulation portion disposed over the second chip side.

According to an embodiment, at least part of the at least one contact area is not covered by the encapsulation material.

According to an embodiment, the at least one contact via includes a first electrically conductive portion disposed over the at least one contact area and a second electrically conductive portion disposed over the encapsulation material.

According to an embodiment, the at least one contact via includes a first electrically conductive portion disposed over the at least one contact area and a second electrically conductive portion disposed over the second encapsulation portion.

The at least one contact via may have an electrical resistance of less or equal 1 Milliohm, e.g. less or equal 0.1 Milliohm, e.g. less or equal 0.01 Milliohm.

Moreover, the at least one contact via may include a plurality or multiplicity of contact vias, e.g. at least two, e.g. at least three, e.g. at least five, e.g. at least 10, e.g. at least 20, e.g. at least 50, e.g. at least 100, or even more, which may all be connected to the same (common) node, e.g. the same electrical pad and thus be connected to the same electrical potential.

Furthermore, the at least one contact via may have a via size (e.g. via diameter) of at least 100 μm, e.g. of at least 200 μm, e.g. of at least 500 μm.

According to an embodiment, the at least one contact via includes at least one material, element or alloy from the following group of materials, the group of materials consisting of: copper, aluminum, silver, tin, gold, palladium, zinc, nickel, iron.

According to an embodiment, the at least one contact via includes an electrically conductive contact portion extending through the first encapsulation portion.

According to an embodiment, the electrically conductive contact portion protrudes from the encapsulation material.

According to an embodiment, the at least one contact via is at least partially surrounded by the first encapsulation portion and the second encapsulation portion.

According to an embodiment, the integrated circuit further includes at least one further contact area formed on the first chip side, and at least one contact structure contacting the at least one further contact area.

According to an embodiment, the at least one contact structure formed over the at least one further contact area extends through the encapsulation material.

According to an embodiment, the integrated circuit further includes a solder material formed over the first chip side and the second chip side, wherein the solder material is disposed on the at least one contact via.

According to an embodiment, the at least one contact via includes a single continuous electrically conductive structure extending through the chip, the first encapsulation portion and the second encapsulation portion.

Various embodiments provide a semiconductor die arrangement including: a semiconductor die; at least one contact via extending through the semiconductor die between a first side of the die and a second side of the die; wherein the at least one contact via electrically contacts a contact area on the second side of the die; and wherein the at least one contact via is coupled to a contacting pad of an external circuit board.

According to an embodiment, the semiconductor die arrangement further includes encapsulation material formed over the first side of the die and the second side of the die, and wherein the at least one contact via extends through the encapsulation material.

According to an embodiment, the semiconductor die arrangement further includes a solder layer disposed on the at least one contact via, wherein the at least one contact via is coupled to the contacting pad of the external circuit board via the solder layer. According to an embodiment, the at least one contact via is directly coupled to the contacting pad of the external circuit board via the solder layer.

According to an embodiment, the semiconductor die arrangement further includes at least one further contact area formed on the first side of the die, and at least one contact structure contacting the at least one further contact area, wherein the at least one contact structure is coupled to a further contacting pad of the external circuit board.

According to an embodiment, the at least one contact structure is directly coupled to the further contacting pad of the external circuit board by a further solder layer disposed over the at least one contact structure.

Various embodiments provide a method for manufacturing an integrated circuit, the method including: at least partially covering a chip with encapsulation material, the chip having a first chip side and a second chip side opposite to the first chip side, the chip including at least one contact area on the second chip side; and forming at least one contact via extending through the encapsulation material and through the chip between the first chip side and the second chip side, the at least one contact via contacting the at least one contact area.

According to an embodiment, forming the at least one contact via includes forming a channel through the chip, the channel extending between the first chip side and the second chip side; and depositing electrically conductive material in the channel to form the at least one contact via.

According to an embodiment, at least partially covering a chip with encapsulation material includes depositing encapsulation material over the first chip side and the second chip side, wherein at least part of the at least one contact area and at least part of the channel is not covered by the encapsulation material.

According to an embodiment, forming the at least one contact via further includes depositing electrically conductive material on the at least one contact area and over at least part of the encapsulation material disposed over the second chip side According to an embodiment, forming the at least one contact via further includes depositing the electrically conductive material in the channel wherein the electrically conductive material is at least partially surrounded by the encapsulation material.

According to an embodiment, forming the at least one contact via includes forming a channel through the chip, the channel extending between the first chip side and the second chip side; and at least partially filling the channel with a single continuous electrically conductive structure, the single continuous electrically conductive structure contacting the at least one contact area and extending between the first chip side and the second chip side.

According to an embodiment, the method further includes depositing a solder material over at least one of the first chip side and the second chip side, wherein the solder material is formed over the at least one contact via.

According to an embodiment, the method further includes coupling the at least one contact via to an external circuit board via the solder material.

Various embodiments provide an integrated circuit including: a chip having a first chip side and a second chip side opposite to the first chip side, the chip including a depletion zone between the first chip side and the second chip side, and at least one contact area formed on the second chip side; encapsulation material at least partially covering the chip; and at least one contact via including electrical conductive material contacting at least one contact area and extending through the depletion zone.

According to an embodiment, the at least one contact via extends through the encapsulation material and through the chip between the first chip side and the second chip side.

According to an embodiment, the at least one contact via includes at least one electrically conductive portion formed over the encapsulation material. According to an embodiment, the at least one contact via includes at least one electrically conductive includes an at least one of an extended pad and a mushroom pad.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
a chip having a first chip side and a second chip side opposite to the first chip side, the chip comprising at least one contact area on the second chip side;
encapsulation material at least partially covering the chip; and
at least one contact via comprising electrical conductive material contacting the at least one contact area and extending through the encapsulation material and through the chip between the first chip side and the second chip side;
wherein the encapsulation material comprises a first encapsulation portion disposed over the first chip side and a second encapsulation portion disposed over the second chip side; and
wherein the at least one contact via is a single continuous electrically conductive structure extending through the chip, the first encapsulation portion and the second encapsulation portion.

2. The integrated circuit according to claim 1, wherein the chip comprises a semiconductor die.

3. The integrated circuit according to claim 1, wherein the chip comprises one or more electronic circuits formed in the chip, the one or more electronic circuits electrical coupled to the at least one further contact area formed on first chip side.

4. The integrated circuit according to claim 1, wherein the chip comprises a power semiconductor chip.

5. The integrated circuit according to claim 1, wherein the encapsulation material comprises a mixture or at least one from the following group of materials, the group of materials consisting of: polymer, epoxy, acrylate, silicone, and high temperature thermoplastic.

6. The integrated circuit according to claim 1, wherein the electrical conductive material has electrical conductivity more than $10^5$ (1 $\Omega$m).

7. The integrated circuit according to claim 1, wherein at least part of the at least one contact area is not covered by the encapsulation material.

8. The integrated circuit according to claim 1, wherein the at least one contact via comprises a first electrically conductive portion disposed over the at least one contact area and a second electrically conductive portion disposed over the encapsulation material.

9. The integrated circuit according to claim 1, wherein the at least one contact via comprises a first electrically conductive portion disposed over the at least one contact area and a second electrically conductive portion disposed over the second encapsulation portion.

10. The integrated circuit according to claim 9, wherein the at least one contact via comprises an electrically conductive contact portion extending through the first encapsulation portion.

11. The integrated circuit according to claim 10, wherein the electrically conductive contact portion protrudes from the encapsulation material.

12. The integrated circuit according to claim 10, wherein the at least one electrically conductive contact portion is formed as at least one of an extended pad and mushroom pad.

13. The integrated circuit according to claim 1, wherein the at least one contact via is at least partially surrounded by the first encapsulation portion and the second encapsulation portion.

14. The integrated circuit according to claim 1, further comprising a solder material formed over the first chip side and the second chip side, wherein the solder material is disposed on the at least one contact via.

15. The integrated circuit according to claim 1, wherein the at least one contact via comprises an electrical resistance of less or equal 1 Milli Ohm.

16. The integrated circuit according to claim 1, further comprising a plurality of contact vias electrically connected to one common node.

17. The integrated circuit according to claim 1, wherein the at least one contact has a via size of at least 100 μm.

18. A semiconductor die arrangement comprising:
a semiconductor die;
at least one contact via comprising electrical conductive material extending through the semiconductor die between a first side of the die and a second side of the die; and
encapsulation material formed over the first side of the die and the second side of the die;
wherein the at least one contact via electrically contacts a contact area on the second side of the die;
wherein the at least one contact via is coupled to a contacting pad of an external circuit board; and
wherein the at least one contact via is a single continuous electrically conductive structure extending through the die and the encapsulation material.

19. The semiconductor die arrangement according to claim 18, further comprising a solder layer disposed on the at least one contact via, wherein the at least one contact via is coupled to the contacting pad of the external circuit board via the solder layer.

20. The semiconductor die arrangement according to claim 18 further comprising
at least one further contact area formed on the first side of the die, and
at least one contact structure contacting the at least one further contact area,
wherein the at least one contact structure is coupled to a further contacting pad of the external circuit board.

21. The semiconductor die arrangement according to claim 20, wherein the at least one contact structure is directly coupled to the further contacting pad of the external circuit board by a further solder layer disposed over the at least one contact structure.

22. A method for manufacturing an integrated circuit, the method comprising:
at least partially covering a chip with encapsulation material, the chip having a first chip side and a second chip side opposite to the first chip side, the chip comprising at least one contact area on the second chip side;
forming at least one contact via extending through the encapsulation material and through the chip between the first chip side and the second chip side, the at least one contact via contacting the at least one contact area;

forming a channel through the chip, the channel extending between the first chip side and the second chip side; and at least partially filling the channel with a single continuous electrically conductive structure, the single continuous electrically conductive structure contacting the at least one contact area and extending between the first chip side and the second chip side.

23. The method according to claim 22, wherein forming the at least one contact via comprises forming a channel through the chip, the channel extending between the first chip side and the second chip side; and depositing electrically conductive material in the channel to form the at least one contact via.

24. The method according to claim 23, wherein forming the at least one contact via further comprises depositing electrically conductive material on the at least one contact area and over at least part of the encapsulation material disposed over the second chip side.

25. The method according to claim 22, wherein forming the at least one contact via further comprises depositing the electrically conductive material in the channel wherein the electrically conductive material is at least partially surrounded by the encapsulation material.

26. An integrated circuit comprising:

a chip having a first chip side and a second chip side opposite to the first chip side, the chip comprising a depletion zone between the first chip side and the second chip side, and at least one contact area formed on the second chip side;

encapsulation material at least partially covering the chip; and at least one contact via comprising a single continuous electrically conductive structure contacting at least one contact area and extending through the depletion zone;

wherein the at least one contact via extends through the encapsulation material and through the chip between the first chip side and the second chip side.

27. The integrated circuit according to claim 26, wherein the at least one contact via comprises at least one electrically conductive portion formed over the encapsulation material.

28. The integrated circuit according to claim 26, wherein the at least one contact via comprises at least one of an extended pad and a mushroom pad.

* * * * *

UNITED STATES PATENT AND TRADEMARK OFFICE
CERTIFICATE OF CORRECTION

| | | |
|---|---|---|
| PATENT NO. | : 8,896,128 B2 | Page 1 of 1 |
| APPLICATION NO. | : 13/678675 | |
| DATED | : November 25, 2014 | |
| INVENTOR(S) | : Khalil Hosseini et al. | |

It is certified that error appears in the above-identified patent and that said Letters Patent is hereby corrected as shown below:

In the Claims

Claim 25 - Column 15, line 19: delete "claim 22" and write --claim 23-- in place thereof.

Signed and Sealed this
Twenty-seventh Day of October, 2015

Michelle K. Lee
*Director of the United States Patent and Trademark Office*